(12) United States Patent
Hirai

(10) Patent No.: US 8,876,261 B2
(45) Date of Patent: Nov. 4, 2014

(54) ACTUATOR, LIQUID EJECTING HEAD, AND LIQUID EJECTING APPARATUS

(75) Inventor: Eiju Hirai, Minamiminowa-mura (JP)

(73) Assignee: Seiko Epson Corporation, Tokyo (JP)

( * ) Notice: Subject to any disclaimer, the term of this patent is extended or adjusted under 35 U.S.C. 154(b) by 782 days.

(21) Appl. No.: 12/953,651

(22) Filed: Nov. 24, 2010

(65) Prior Publication Data

US 2011/0122205 A1 May 26, 2011

(30) Foreign Application Priority Data

Nov. 26, 2009 (JP) .................. 2009-268613

(51) Int. Cl.
B41J 2/045 (2006.01)
B41J 2/14 (2006.01)
H01L 41/047 (2006.01)
H01L 41/09 (2006.01)

(52) U.S. Cl.
CPC .......... B41J 2/14233 (2013.01); B41J 2202/18 (2013.01); H01L 41/047 (2013.01); B41J 2002/14241 (2013.01); B41J 2002/14491 (2013.01); H01L 41/0973 (2013.01)
USPC .......................................... 347/70

(58) Field of Classification Search
None
See application file for complete search history.

(56) References Cited

U.S. PATENT DOCUMENTS

2008/0239020 A1* 10/2008 Sugahara .................. 347/70

FOREIGN PATENT DOCUMENTS

JP 2005-088441 4/2005

* cited by examiner

Primary Examiner — Jerry Rahill
(74) Attorney, Agent, or Firm — Workman Nydegger

(57) ABSTRACT

An actuator includes a vibration plate, a first conductive layer formed on an upper surface of the vibration plate and extending in a predetermined direction, a piezoelectric layer covering the first conductive layer, a second conductive layer formed on an upper surface of the piezoelectric layer, a metal layer formed on the upper surface of the vibration plate and on an upper surface of the second conductive layer, and an electrode electrically connected to the metal layer. The first conductive layer, the second conductive layer, and the piezoelectric layer interposed between the first and second conductive layers form a driving unit. A plurality of the driving units are disposed in a direction perpendicular to the predetermined direction. The metal layer intersects a plurality of the second conductive layers so as to be electrically connect the plurality of second conductive layers.

15 Claims, 7 Drawing Sheets

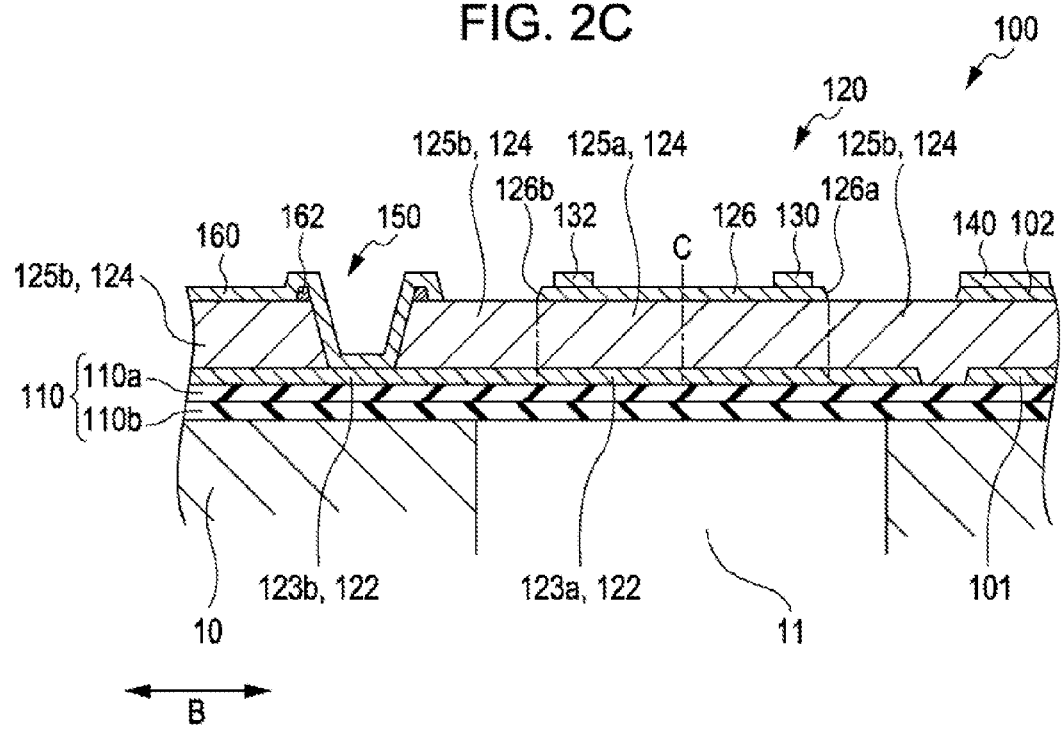
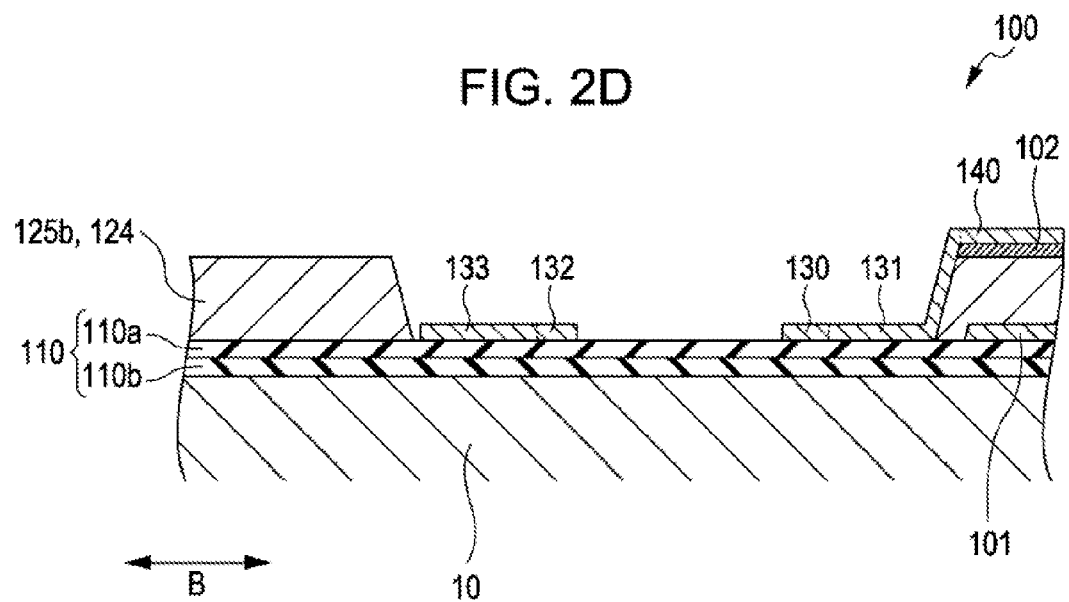

ACTUATOR, LIQUID EJECTING HEAD, AND LIQUID EJECTING APPARATUS

BACKGROUND OF THE INVENTION

The entire disclosures of Japanese Patent Application No. 2009-268613, filed Nov. 26, 2009 is expressly incorporated herein by reference.

1. Technical Field

The present invention relates to an actuator, a liquid ejecting head, and a liquid ejecting apparatus. More specifically, the present invention relates to an actuator, liquid ejecting head, and a liquid ejecting apparatus which includes a plurality of driving units which are connected together at a low resistance.

2. Related Art

In various liquid ejecting apparatuses currently used in the art, such as ink jet printers, actuators are used which include a piezoelectric element which causes the apparatus to eject liquid droplets such as ink. The piezoelectric element can function as a driving unit displacing a vibration plate, for example. Such an actuator is provided with a plurality of pressure chambers. Moreover, a driving unit is disposed on a vibration plate in each pressure chamber.

Typically, in the actuator including the plurality of driving units, one electrode of the driving unit serves as an individual electrode and the other electrode of the driving unit serves as a common electrode and also electrically connects the plurality of driving units to each other. For example, in the Japanese Patent Document No. JP-A-2005-88441, an upper electrode film serves as an individual electrode while a lower electrode film is disposed to extend from one end portion of a pressure chamber in a longitudinal direction to a circumferential wall and is connected on the circumferential wall so as to serve as a common electrode. In this way, the plurality of piezoelectric elements can be electrically connected to each other. In the actuator including the plurality of driving units, it is preferable that the plurality of driving units are connected to each other at a low resistance.

BRIEF SUMMARY OF THE INVENTION

An advantage of some aspects of the invention is that it provides an actuator capable of connecting a plurality of driving units to each other at a low resistance. Another advantage of some aspects of the invention is that it provides a liquid ejecting head including the actuator and a liquid ejecting apparatus.

A first aspect of the invention is an actuator including a vibration plate, a first conductive layer formed on an upper surface of the vibration plate and extending in a predetermined direction, a piezoelectric layer covering the first conductive layer, a second conductive layer formed on an upper surface of the piezoelectric layer, a metal layer formed on the upper surface of the vibration plate and on an upper surface of the second conductive layer, and an electrode electrically connected to the metal layer. The first conductive layer, the second conductive layer, and the piezoelectric layer interposed between the first and second conductive layers form a driving unit. A plurality of the driving units are disposed in a direction perpendicular to the predetermined direction. The metal layer intersects a plurality of the second conductive layers so as to be electrically connected to the plurality of second conductive layers.

According to the actuator having the configuration, the plurality of second conductive layers can be electrically connected to each other by the metal layer. Accordingly, the plurality of driving units can be connected to each other at a low resistance.

In the description of the aspect of the invention, the term, the "upper surface", is used as in "another specific member (hereinafter, referred to as "B") is formed on the "upper surface" of a specific member (hereinafter, referred to as "A")". In the description of the aspect of the invention, in this case, the term, the "upper surface" is used in a case where B is directly formed on A and a case where B is formed on A with another member interposed therebetween.

In the actuator described above, the manufacturing process can be simplified.

Another aspect of the invention is a liquid ejecting head including the actuator described above and a pressure chamber which communicates with a nozzle hole and of which a volume is varied by an operation of the actuator.

According to the liquid ejecting head, the plurality of driving units can be connected to each other at a low resistance since the liquid ejecting head includes the actuator according to the above aspect of the invention.

According to still another aspect of the invention, there is provided a liquid ejecting apparatus including the liquid ejecting head according to the above aspect of the invention.

According to the liquid ejecting apparatus, the plurality of driving units can be connected to each other at a low resistance since the liquid ejecting apparatus includes the liquid ejecting head according to the above aspect of the invention.

BRIEF DESCRIPTION OF THE DRAWINGS

The invention will be described with reference to the accompanying drawings, wherein like numbers reference like elements.

FIG. 2C is a sectional view schematically illustrating the main units of the liquid ejecting head according to the embodiment;

FIG. 2D is a sectional view schematically illustrating the main units of the liquid ejecting head according to the embodiment;

DESCRIPTION OF EXEMPLARY EMBODIMENTS

Hereinafter, a preferred embodiment of the invention will be described with reference to the drawings.

1. Actuator and Liquid Ejecting Head

First, an actuator 100 and a liquid ejecting head 1000 according to an embodiment will be described. Here, a case where the actuator 100 is used in the liquid ejecting head 1000 as an example of an actuator 100 will be described. The usage of the actuator 100 is not limited to the liquid ejecting head and other uses may be envisioned which do not depart from the scope of the claims.

Figure 1:
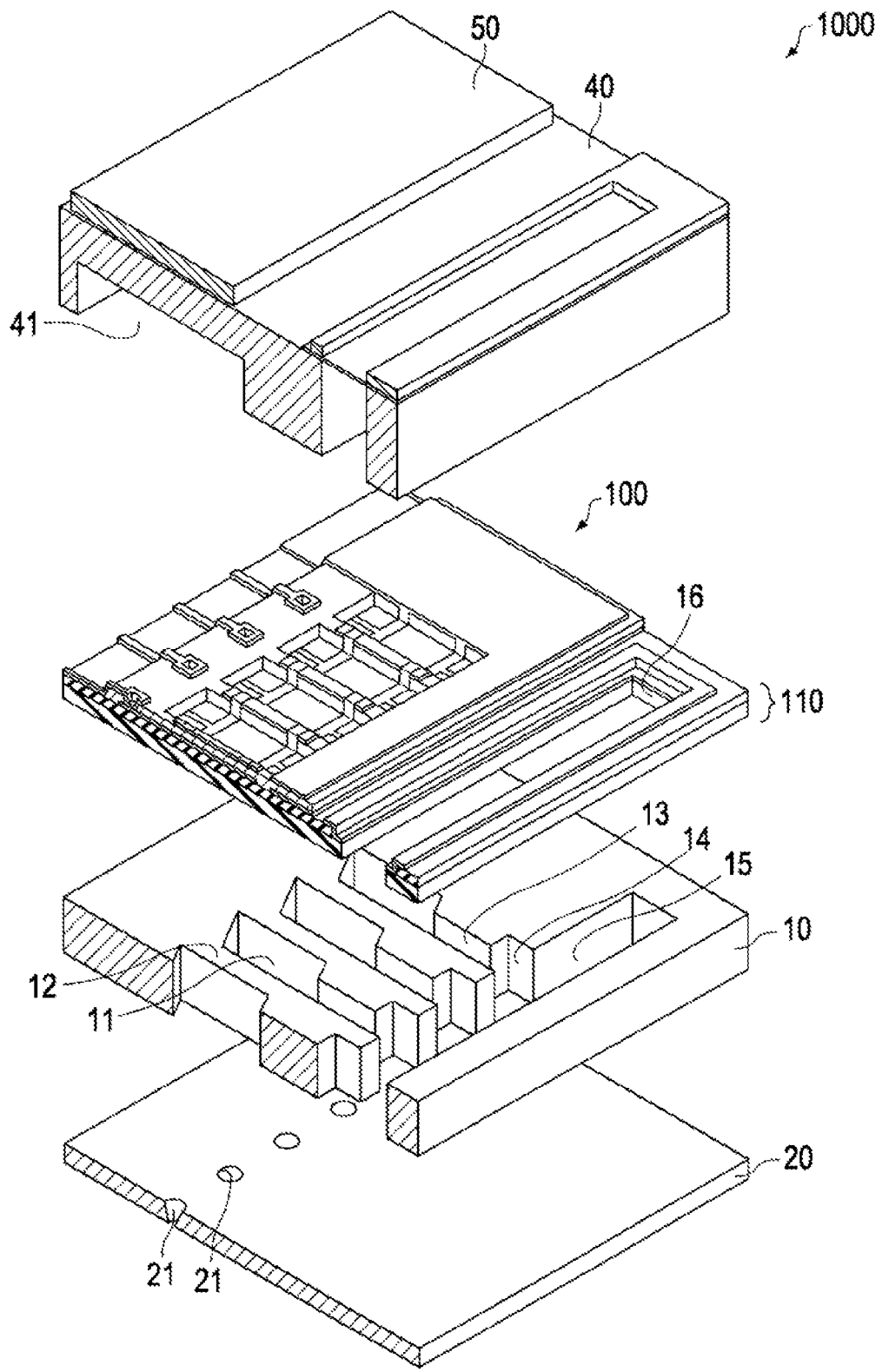
FIG. 1 is an exploded perspective view schematically illustrating a liquid ejecting head according to one embodiment of the invention.
Figure 2A:
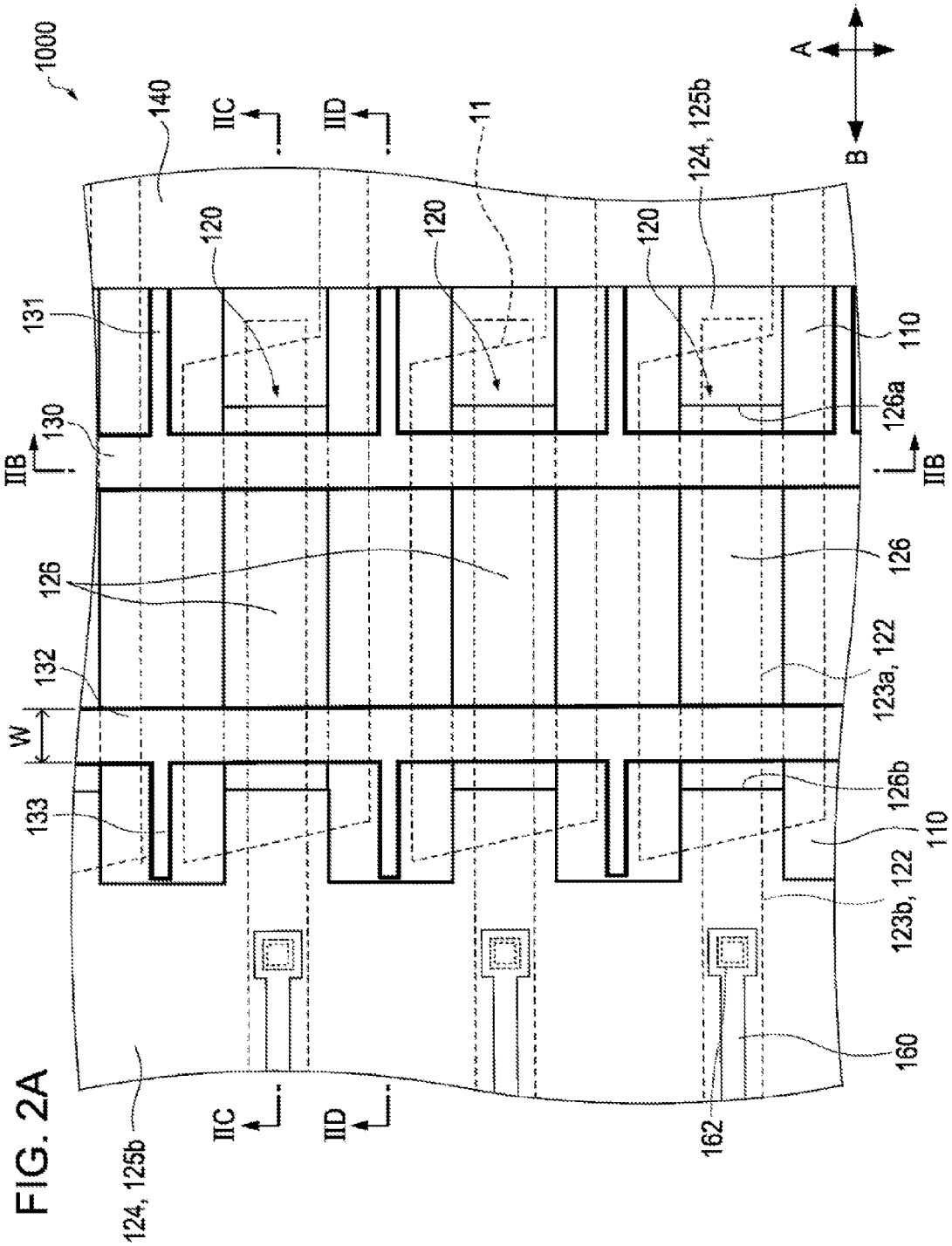
FIG. 2A is a plan view schematically illustrating main units of the liquid ejecting head according to the embodiment.
Figure 2B:
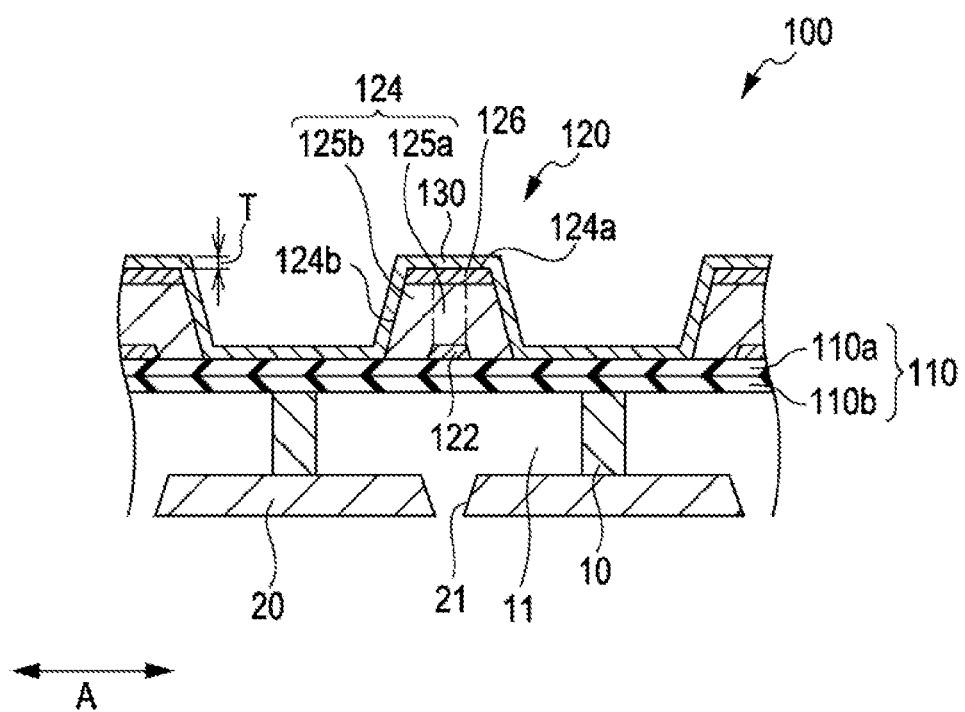
FIG. 2B is a sectional view schematically illustrating the main units of the liquid ejecting head according to the embodiment.

FIG. 1 is an exploded perspective view schematically illustrating the liquid ejecting head 1000 including the actuator 100 according to this embodiment. FIG. 2A is a plan view schematically illustrating a passage forming plate 10 and the actuator 100 as the main units of the liquid ejecting head 1000. FIG. 2B is a sectional view taken along the line IIB-IIB of FIG. 2A. FIG. 2C is a sectional view taken along the line IIC-IIC of FIG. 2A. FIG. 2D is a sectional view taken along the line IID-IID of FIG. 2A.

The liquid ejecting head 1000 includes an actuator 100 and pressure chambers 11 which respectively communicate with nozzle holes 21 and of which a volume is varied by the operation of the actuator 100, as shown in FIG. 1 and FIGS. 2A to 2D. The liquid ejecting head 1000 includes, for example, the passage forming plate 10, a nozzle plate 20, and a sealing plate 40. The actuator 100 includes a vibration plate 110, driving units 120, metal layers (a first metal layer 130 and a second metal layer 132), an electrode (hereinafter, referred to as a "common electrode") 140, and lead electrodes 160. The driving unit 120 includes a first conductive layer 122, a second conductive layer 126, and a piezoelectric layer 124 interposed between the first conductive layer 122 and the second conductive layer 126.

The passage forming plate 10 includes the pressure chambers 11. As shown in FIG. 1, the passage forming plate 10 includes wall sections 12 forming a side wall of the pressure chamber 11. The passage forming plate 10 may include a reservoir 15 communicating with the pressure chambers 11 via supply passages 13 and communication passages 14. A through hole 16 may be formed in the reservoir 15. A liquid may be supplied from the outside of the liquid ejecting head 100 to the reservoir 15 via the through hole 16. When the liquid is supplied to the reservoir 15, the liquid can be supplied to the pressure chambers 11 via the supply passages 13 and the communication passages 14. The shape of the pressure chamber 11 is not particularly limited. For example, the pressure chamber 11 may have a parallelogram or rectangular shape in a plan view. Additionally, the number of pressure chambers 11 is not particularly limited. One or a plurality of pressure chambers may be disposed. Furthermore, the material of the passage forming plate 10 is not particularly limited. The passage forming plate 10 is formed of, for example, single crystal silicon, nickel, stainless, stainless steel, or glass ceramic.

The nozzle plate 20 is formed on the lower surface of the passage forming plate 10, as shown in FIG. 1. The nozzle plate 20 is a plate-shaped member and has nozzle holes 21. The nozzle hole 21 is formed to communicate with the pressure chamber 11. The shape of the nozzle hole 21 is not particularly limited, as long as the liquid is ejected from the nozzle hole 21. For example, the liquid in the pressure chamber 11 can be ejected toward the lower side of the nozzle plate 20 via the nozzle hole 21. The number of nozzle holes 21 is not particularly limited. One or more nozzle holes 21 may be formed. The material of the nozzle plate 20 is not particularly limited. The nozzle plate 20 is formed of, for example, single crystal silicon, nickel, stainless, stainless steel, or glass ceramic.

The actuator 100 is formed on the passage forming plate 10, as shown in FIG. 1. The driving unit 120 of the actuator 100 includes the first conductive layer 122, the second conductive layer 126, and the piezoelectric layer 124 interposed between the first conductive layer 122 and the second conductive layer 126. In the actuator 100, the driving unit 120 is electrically connected to an external driving circuit 50 and is moved (vibrated or deformed) based on a signal of the external driving circuit 50. The vibration plate 110 is displaced by the operation of the driving units 120 to change the internal pressure of the pressure chamber 11 appropriately. The plurality of driving units 120 is disposed in the plurality of pressure chambers 11, respectively. As shown in FIG. 2A, the plurality of driving units 120 is disposed in a first direction A which is perpendicular to a longitudinal direction of the first conductive layer 122.

The vibration plate 110 is formed on the passage forming plate 10, as shown in FIG. 1 and FIGS. 2A to 2D. For example, the vibration plate 110 is a plate-shaped member. The configuration and material of the vibration plate 110 are not particularly limited. In the example of FIG. 2B, the vibration plate 110 includes a first layer 110a and a second layer 110b. The first layer 110a is formed of, for example, zirconium oxide. The second layer 110b is formed of, for example, silicon oxide. The material of the vibration plate 110 is not limited thereto and other materials may be used without departing from the meaning or scope of the claims. For example, a single layer structure of an insulation film formed of zirconium oxide or silicon oxide, a metal layer formed of nickel or the like, or a polymer material film formed of polyimide or the like or a lamination structure of a plurality of materials. The vibration plate 110 can vibrate (be deformed) by deformation of the driving unit 120. In this way, the volume of the pressure chamber 11 formed in the downward direction can be changed.

The first conductive layer 122 is formed on the upper surface of the vibration plate 110. As shown in FIG. 2A, the first conductive layer 122 is formed to extend in a second direction B. Examples of the material of the first conductive layer 122 include various kinds of metal such as nickel, iridium, and platinum, a conductive oxide (for example, iridium oxide), a composite oxide ($SrRuO_x$: SRO) of strontium and ruthenium, and a composite oxide ($LaNiO_x$: LNO) of lanthanum and nickel. The first conductive layer 122 may have a single structure of the exemplified material or a lamination structure composed of a plurality layers of material(s). An adhesion layer or the like may be formed between the first conductive layer 122 and the vibration plate 110. For example, a titanium layer may be used as the adhesion layer. For example, the thickness of the first conductive layer 122 is in the range from 50 nm to 300 nm. As shown in FIG. 2C, the first conductive layer 122 includes a first conductive portion 123a of the driving unit 120. One function of the first conductive portion 123a is as an electrode (a lower electrode formed on the lower side of the piezoelectric layer 124) applying a voltage to the piezoelectric layer 124. The first conductive portion 123a is a region overlapping with the second conductive layer 126 via the piezoelectric layer 124, when viewed in the thickness direction of the vibration plate 110. The first conductive layer 122 may include a second conductive portion 123b. The second conductive portion 123b functions as connecting the lead electrode 160 electrically to the first conductive portion 123a. In the illustrated example, the second conductive portion 123b extends from the first conductive portion 123a to an opening 150. For example, the actuator 100 may have a metal film 101 (see FIGS. 2C and 2D) in the region overlapping with the common electrode 140, when viewed in the thickness direction of the vibration plate 110. For example, the metal layer 101 may not be electrically connected to any member.

The piezoelectric layer 124 is formed to cover the first conductive layer 122. As shown in FIG. 2B, the piezoelectric layer 124 covers the upper surface and side surfaces of the first conductive layer 122 and the upper surface of the vibration plate 110. Another layer may be formed between the piezoelectric layer 124 and the first conductive layer 122. For example, an alignment control layer (for example, a titanium layer) may be formed as another layer to control alignment of the crystal of the piezoelectric layer 124. The thickness of the piezoelectric layer 124 is in the range from 300 nm to 3000 nm, for example. When the thickness of the piezoelectric layer 124 is not in this range, the necessary expansion and contraction when the vibration plate 110 is deformed may not be obtained.

The piezoelectric layer 124 includes an upper surface 124a and a side surface 124b connected to the upper surface 124a. In the example of FIG. 2B, the upper surface 124a of the piezoelectric layer 124 is a flat surface and is substantially parallel to the upper surface of the vibration plate 110. The upper surface 124a of the piezoelectric layer 124 is not necessarily limited to the flat surface, but may have a convex shape to which the shape of the first conductive layer 122 of an underlying layer is reflected. The side surface 124b of the piezoelectric layer 124 is a surface connecting the upper surface 124a of the piezoelectric layer 124 to the upper surface of the vibration layer 110. The side surface 124b of the piezoelectric layer 124 may be formed as one flat surface or may include a plurality of flat surfaces. The side surface 124b of the piezoelectric layer 124 may include a curved surface.

The piezoelectric layer 124 is formed of a piezoelectric material. Therefore, the piezoelectric layer 124 is deformable when an electric field is applied by the first conductive layer 122 and the second conductive layer 126. The vibration plate 110 can sag or vibrate by the deformation. The piezoelectric layer 124 includes a first region 125a interposed between the first conductive layer 122 and the second conductive layer 126, when viewed in the thickness direction of the vibration plate 110. The first region 125a of the piezoelectric layer 124, the first conductive layer 122, and the second conductive layer 126 form the driving unit 120. The driving unit 120 serves as a piezoelectric element in such a manner that the piezoelectric layer 124 is interposed between the two conductive layers 122 and 126 to form a capacitor. The piezoelectric layer 124 may also include a second region 125b. The second region 125b may be a region other than the first region 125a of the piezoelectric layer 124. That is, the second region 125b may be a region to which the electric field is not applied by the first conductive layer 122 and the second conductive layer 126. As shown in FIG. 2C, for example, the opening 150 is formed in the second region 125b. With such a configuration, the first conductive layer 122 and the lead electrode 160 may be electrically connected to each other.

A perovskite type oxide expressed as a general expression $ABO_3$ (for example, A includes Pb and B includes Zr and Ti) is very suitable for the material of the piezoelectric layer 124. Specific examples of this material include lead zirconate titanate $(Pb(Zr, Ti)O_3)$ (hereinafter, abbreviated to PZT), barium titanate $(BaTiO_3)$, and niobium acid potassium sodium $((K, Na) NbO_3)$. Among these materials, PZT is very suitable as the material of the piezoelectric layer 124, since the piezoelectric characteristic is good.

The second conductive layer 126 is formed on the upper surface of the piezoelectric layer 124. The second conductive layer 126 may be formed on the upper surface 124a of the piezoelectric layer 124. The second conductive layer 126 extends in the second direction B. The length of the second conductive layer 126 in the second direction B is equal to the length of the first region 125a in the second direction B, as shown in FIG. 2C. The thickness of the second conductive layer 126 is not particularly limited. For example, the thickness of the second conductive layer 126 may be in the range from 20 nm to 200 nm. One of the functions of the second conductive layer 126 is the other electrode (an upper electrode formed in the upper portion of the piezoelectric layer 124) applying a voltage to the piezoelectric layer 124. Examples of the material of the second conductive layer 126 include various kinds of metal such as nickel, iridium, platinum, tungsten, and gold, conductive oxides (for example, iridium oxide) thereof, $SrRuO_3$, and $LaNiO_3$. The second conductive layer 126 may have a structure of a single layer or a lamination structure consisting of a plurality of layers.

Since the second conductive layer 126 is formed on the upper surface 124a of the piezoelectric layer 124, the second conductive layer 126 is not formed on the side surface 124b of the piezoelectric layer 124 and the vibration plate 110. In the actuator 100, it is preferable that the vibration plate 110 before voltage application is located on the upper surface. Therefore, since the deformation of the vibration plate 110 necessary for obtaining the same displacement amount can be suppressed as small as possible, it is possible to prevent breakage caused by the deformation of the vibration plate 110 at the time of voltage application. However, since the piezoelectric layer 124 formed of a sol-gel method or the like generally has a tension stress, it is easy for the vibration plate 110 before voltage application to be located on the lower side. Here, the second conductive layer 126 is formed by a sputter method, and thus generally has a compression stress. For this reason, in the actuator 100, the tension stress of the piezoelectric layer 124 is cancelled, when the second conductive layer 126 is formed on the upper surface of the piezoelectric layer 124. Therefore, the vibration plate 110 before the voltage application can be operated so as to be located on the upper surface. When the second conductive layer 126 is not formed on the side surface 124b of the piezoelectric layer 124 and on the vibration plate 110, the vibration plate 110 before the voltage application is not operated so as to be located on the lower side. Therefore, by forming the second conductive layer 126 on the upper surface of the piezoelectric layer 124 and not forming the second conductive layer 126 on the side surface 124b of the piezoelectric layer 124 and on the vibration plate 110, the vibration plate 110 before the voltage application can be located on the upper surface. Accordingly, it is possible to prevent the breakage caused by the deformation of the vibration plate 110 at the time of voltage application.

The metal layers 130 and 132 intersect the second conductive layers 126 of the plurality of driving units 120. In the example of FIG. 2A, the metal layers 130 and 132 extend in the first direction A to intersect the second conductive layers 126 of the plurality of driving units 120. The metal layers 130 and 132 may be formed of a layer with conductivity. Therefore, the second conductive layers 126 of the plurality of driving units 120 can be electrically connected to each other. As shown in FIG. 1, the metal layers 130 and 132 are electrically connected to the common electrode 140 in the ends of the metal layers 130 and 132 in the first direction A. The resistances of the metal layers 130 and 132 can be easily controlled by a width W (see FIG. 2A) and a thickness T (see FIG. 2B). That is, by enlarging the width W or thickening the thickness T, the resistances of the metal layers 130 and 132 can be reduced. A plurality of the metal layers 130 and 132 may be provided. By increasing the number of metal layers 130 and 132, the plurality of second conductive layers 126 can be connected to each other at a lower resistance. When the metal layers 130 and 132 are disposed, the displacement of the actuator 100 is disturbed. Therefore, the numbers of metal layers 130 and 132 are determined depending on adjustment of the displacement amount and the resistance value. The metal layers 130 and 132 can have a lamination structure of nickel-chrome (Ni—Cr) alloy and gold (Au). Therefore, since the metal layers 130 and 132, the common electrode 140, and the lead electrode 160 can be formed in the same process, as described below, the metal layers 130 and 132, the common electrode 140, and the lead electrode 160 can be manufactured by a simple and easy process. The structure of the metal layers 130 and 132 is not limited to the lamination structure of nickel-chrome alloy and gold. For example, a single-layer structure or a lamination structure of nickel-chrome alloy, gold, platinum (Pt), iridium (Ir), and the like may be used.

The metal layers 130 and 132 are formed on the upper surface of the vibration plate 110 and on the upper surface of the second conductive layer 126. In the example of FIG. 2B, the metal layers 130 and 132 are formed on the vibration plate 110, the side surface 124b of the piezoelectric layer 124, and the upper surface of the second conductive layer 126. By forming the metal layers 130 and 132 on the second conductive layer 126, the piezoelectric layer 124 can be prevented from being deformed. In the illustrated example, two metal layers 130 and 132, that is, the first metal layer 130 and the second metal layer 132 are formed, but the number of metal layers is not limited. As shown in FIG. 2C, the first metal layer 130 is formed on the second conductive layer 126 and is located close to a first end surface 126a which is one side of the second conductive layer 126. The second metal layer 132 is formed on the second conductive layer 126 and is located close to a second end surface 126b which is the other side of the second conductive layer 126. With such a configuration, the piezoelectric layer 124 can be prevented from being displaced near the end surfaces 126a and 126b which are regions where the excessive stress is focused due to the deformation of the piezoelectric layer 124. It is preferable that the distance between the first metal layer 130 and the first end surface 126a and the distance between the second metal layer 132 and the second end surface 126b are small. In this way, the piezoelectric layer 124 can be further prevented from being displaced. Since the metal layers 130 and 132 are formed in the regions excluding a central region C (see FIG. 2C) of the first region 125a in a plan view, the displacement of the piezoelectric layer in the vicinity of the central region C is not disturbed. Here, the end surfaces 126a and 126b may be both end surfaces of the second conductive layer 126 in the second direction B. When the second conductive layer 126 is continuously formed with other layers (not shown), the end surfaces 126a and 126b of the second conductive layer 126 may be present in surfaces which are not exposed. It can be considered that the first metal layer 130 is, for example, formed on the second conductive layer 126 and is located near one end portion of the second conductive layer 126 and the second metal layer 132 is, for example, formed on the second conductive layer 126 and is located near the other end portion of the second conductive layer 126. The metal layers 130 and 132 can control the deformation degree of the piezoelectric layer 124 depending on the width W and the thickness T of the metal layers 130 and 132. That is, by enlarging the width W of the metal layers 130 and 132 and thickening the thickness T of the metal layers 130 and 132, the piezoelectric layer 124 can be further prevented from being deformed.

As shown in FIG. 2C, the first metal layer 130 and the second metal layer 132 may be disposed at the position at which the distances between the central region C and the respective metal layers 130 and 132 are the same as each other. In this way, since the metal layers 130 and 132 can be disposed with good balance in the driving unit 120, stress is not focused on a part of the actuator 100 and the actuator 100 with a good rigidity balance can be obtained. In the illustrated example, the metal layers 130 and 132 are formed on the second conductive layer 126 so as to be close to the end surfaces 126a and 126b, respectively, as described above. However, the positions at which the metal layers 130 and the 132 are formed on the second conductive layer 126 are not particularly limited.

The metal layers 130 and 132 may have extension portions 131 and 133. The first metal layer 130 may have the first extension portion 131 and the second metal layer 132 may have the second extension portion 133. The first extension portion 131 is formed between the adjacent driving units 120, as shown in FIG. 2A. The first extension portion 131 extends from the first metal layer 130 extending in the first direction A to the first end surface 126a of the second conductive layer 126. The first extension portion 131 extends toward the outside of the region, where the plurality of driving units 120 is formed, further outside than the first end surface 126a in a plan view (see FIG. 2A). The first extension portion 131 continues to be formed to the common electrode 140, as shown in FIG. 2D. That is, the first metal layer 130 can be electrically connected to the common electrode 140 by the first extension portion 131. In this way, the plurality of second conductive layers 126 can be connected at a lower resistance. The second extension portion 133 is formed between the adjacent driving units 120, as shown in FIG. 2A. The second extension portion 133 extends from the second metal layer 132 extending in the first direction A to the second end surface 126b of the second conductive layer 126. The second extension portion 133 extends toward the outside of the region, where the plurality of driving units 120 are formed, further outside than the second end surface 126b in a plan view (see FIG. 2A). That is, the first extension portion 131 extends in the direction opposite to the direction in which the second metal layer 132 extends in a plan view. Therefore, the second extension portion 133 extends in the direction opposite to the direction in which the first metal layer 130 extends. The first extension portion 131 and the second extension portion 133 extend from the metal layers 130 and 132 in the second direction B in opposite directions. Therefore, it is possible to suppress focus on the stress caused by addition of the rigidity of only the vicinity of the first extension portion 131 of the vibration plate 110 when only the first extension portion 131 is formed. In the actuator 100, the rigidity can be satisfactorily balanced since the extension portions 131 and 133 are formed in the first metal layer 130 and the second metal layer 132, respectively. Although not illustrated, at least a part of the second extension portion 133 may be electrically connected to the common electrode 140. In this way, the plurality of second conductive layers 126 can be connected at a lower resistance.

The common electrode 140 is electrically connected to the metal layers 130 and 132. That is, the common electrode 140 is electrically connected to the plurality of second conductive layers 126 by the metal layers 130 and 132. For example, the common electrode 140 is electrically connected to the external driving circuit 50. As shown in FIG. 2D, for example, the common electrode 140 is formed on the upper surface of the piezoelectric layer 124 (the second region 125b). As shown in FIG. 1, the common electrode 140 is formed in the periphery (outside region) of the regions where the driving units 120 are arranged. For example, the common electrode 140 can be formed from a layer with the same material as that of the metal layers 130 and 132. The common electrode 140 is not limited thereto, but the common electrode may be a layer with conductivity. For example, the common electrode 140 may be connected to a layer 102 with the same material as that of the second conductive layer 126.

The lead electrode 160 is formed so as to cover at least the opening 150. The lead electrode 160 is an electrode electrically connecting the external driving circuit 50 to the first conductive portion 123a of the first conductive layer 122 via the second conductive portion 123b of the first conductive layer 122, for example. The lead electrode 160 may be formed of the same material as that of the metal layers 130 and 132, but the invention is not limited thereto. A conductive portion 162 formed of the same material as that of the second conductive layer 126 may be formed round the opening 150.

The sealing plate 40 can seal the driving units 120. The sealing plate 40 has a region 41 sealing the driving units 120. The size and shape of the region 41 of the sealing plate 40 are not particularly limited, as long as the region 41 does not disturb the deformation of the driving unit 120 (piezoelectric layer 124). The sealing plate 40 is formed of, for example, single crystal silicon, nickel, stainless, stainless steel, or glass ceramic.

The liquid ejecting head 1000 may include a case (not shown) formed of various kinds of resin materials or various kinds of metal materials and accommodating the above-described configuration.

For example, the actuator 100 has the following features:

In the actuator 100, the metal layers 130 and 132 intersect the second conductive layers 126 of the plurality of driving units 120 and electrically connect the plurality of second conductive layers 126 to the common electrode 140. The metal layers 130 and 132 can connect the plurality of second conductive layers 126 at a low resistance since the width W or the thickness T of the metal layers 130 and 132 can be easily controlled. By increasing the number of metal layers 130 and 132, the plurality of second conductive layers 126 can be connected to each other at a lower resistance. According to the actuator 100, the plurality of driving units 120 can be connected to each other at a low resistance.

The actuator 100 includes the metal layers 130 and 132 on the upper surface of the second conductive layers 126. Therefore, it is possible to control the displacement of the piezoelectric layer 124 in the periphery of the regions where the metal layers 130 and 132 are formed. According to the actuator 100, for example, it is possible to prevent the breakage caused by the excessive displacement of the piezoelectric layer 124. Accordingly, the reliability can be improved. Moreover, the first metal layer 130 can be formed close to the first end surface 126a of the second conductive layer 126 and the second metal layer 132 can be formed close to the second end surface 126b of the second conductive layer 126. With such a configuration, it is possible to suppress the displacement of the piezoelectric layer 124 in the region where the excessive stress caused by the deformation of the piezoelectric layer 124 is focused. Moreover, the displacement in the vicinity of the central region C of the first region 125a of the piezoelectric layer 124 is not disturbed.

In the actuator 100, the first metal layer 130 may include the first extension portion 131 electrically connected to the common electrode 140. With such a configuration, the plurality of second conductive layers 126 can be connected to each other at a lower resistance. In the actuator 100, the second metal layer 132 may include the second extension portion 133. In the actuator 100 with such a configuration, the extension portions 131 and 133 are formed in the first metal layer 130 and the second metal layer 132, respectively. Therefore, the rigidity of the vibration plate 110 can be satisfactorily balanced compared to a case where the extension portion 131 is formed only in the first metal layer 130. Accordingly, according to the actuator 100, the reliability can be improved.

The actuator 100 has the above-described features. Accordingly, according to the liquid ejecting head 1000 including the actuator 100, the plurality of driving units 120 can be connected to each other at a low resistance. Moreover, according to the liquid ejecting head 1000, the actuator 100 capable of controlling the displacement amount of the vibration plate 110 using the metal layers 130 and 132 can be used. Therefore, for example, since desired liquid droplets can be ejected, the reliability can be improved.

2. Method of Manufacturing Actuator and Liquid Ejecting Head

Next, a method of manufacturing the actuator 100 and the liquid ejecting head 1000 according to this embodiment will be described with reference to the drawings. FIGS. 3 to 7 are sectional views schematically illustrating the method of manufacturing the actuator 100 and the liquid ejecting head 1000.

Figure 3:
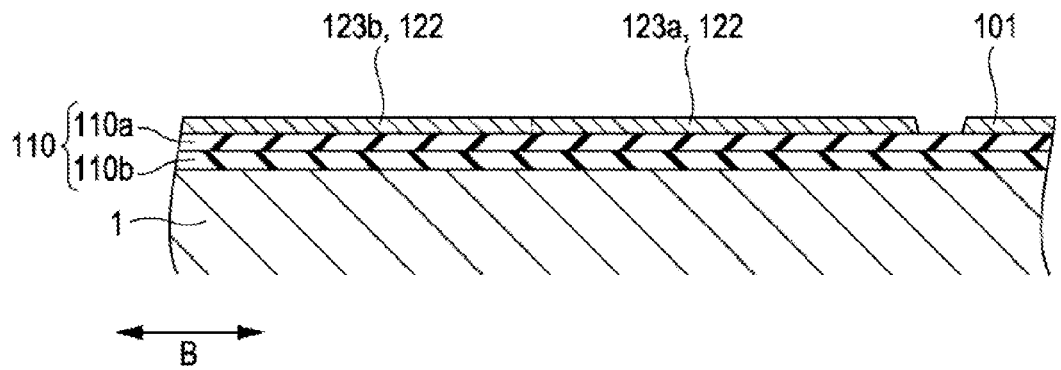
FIG. 3 is a sectional view schematically illustrating a process of manufacturing the liquid ejecting head according to the embodiment.

As shown in FIG. 3, the vibration plate 110 is first formed on, for example, a silicon substrate 1. The vibration plate 110 is formed by a known film forming technique such as a sputter method. The vibration plate 110 may be formed by forming a plurality of layers. Next, the first conductive layer 122 is formed on the vibration plate 110. The first conductive layer 122 can be formed by a sputter method, a coating method, a vacuum deposition method, or the like. More specifically, the first conductive layer 122 can be formed by forming a conductive layer (not shown) on the entire surface of the vibration plate 110 and patterning the conductive layer. Here, an etching protective film (not shown) may be formed on the conductive layer before the conductive layer for forming the first conductive layer 122 is patterned by etching. The etching protective film may be present in the piezoelectric layer formed of the same piezoelectric material as that of the piezoelectric layer 124, which is described below. The etching protective film may be formed at least in the region where the first conductive layer 122 to be patterned in a desired shape is formed. Then, in the etching process of patterning the first conductive layer 122, the surface of the first conductive layer 122 can be protected from the chemical damage caused by an etchant to be used.

Figure 4:
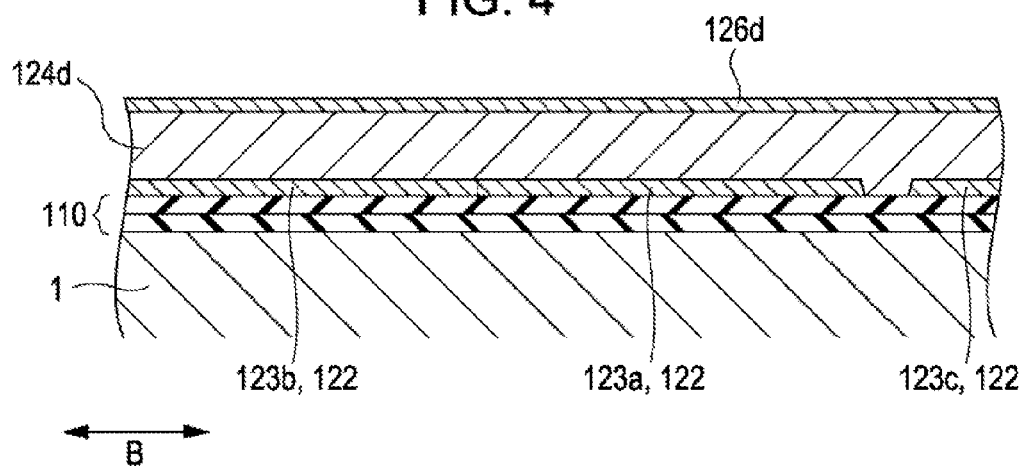
FIG. 4 is a sectional view schematically illustrating a process of manufacturing the liquid ejecting head according to the embodiment.

As shown in FIG. 4, the piezoelectric layer 124d is formed to cover the first conductive layer 122. The piezoelectric layer 124d may be formed of the same material as that of the piezoelectric layer 124. The piezoelectric layer 124d may be formed by, for example, a sol-gel method, a chemical vapor deposition (CVD) method, a metal organic deposition (MOD) method, a sputter method, or a laser ablation method. Here, when the material of the piezoelectric layer 124d is PZT, for example, the piezoelectric layer 124d can be crystallized by performing annealing at about 700° C. under an oxygen atmosphere. The crystallization may be achieved after the piezoelectric layer 124d is patterned. When the etching protective film is formed of the same material as that of the piezoelectric layer 124d, the etching protective film can be integrally formed with the piezoelectric layer 124d by performing annealing. Next, a conductive layer 126d is formed on the entire surface of the piezoelectric layer 124d. For example, the conductive layer 126d is formed of, for example, the same material as that of the second conductive layer 126d. The second conductive layer 126d may be formed by, for example, a sputter method, a coating method, or a vacuum deposition method.

Figure 5:
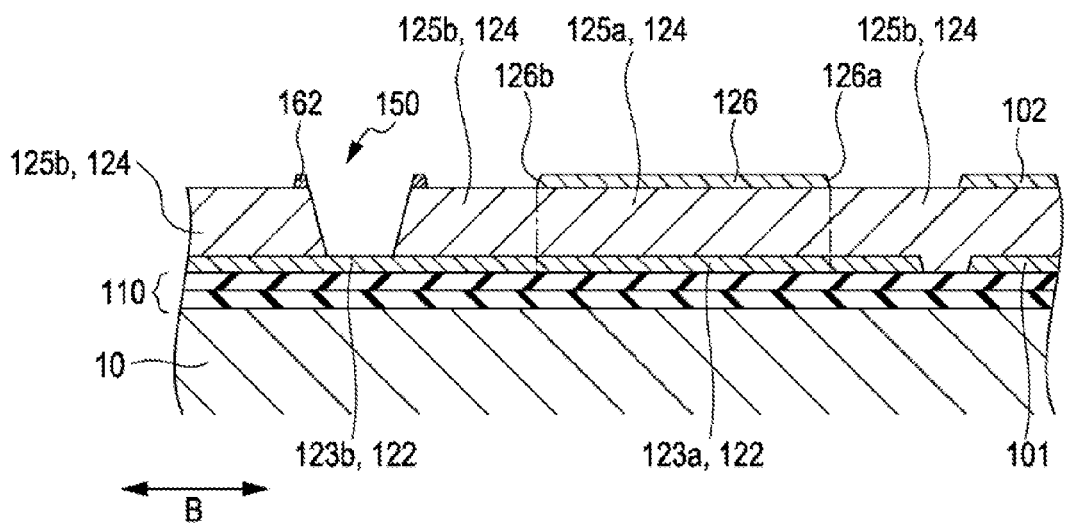
FIG. 5 is a sectional view schematically illustrating a process of manufacturing the liquid ejecting head according to the embodiment.

As shown in FIG. 5, the conductive layer 126d and the piezoelectric layer 124d are patterned. The patterning can be performed by, for example, a known photolithography technique or a known etching technique. In this way, the piezoelectric layer 124 is formed. The opening 150 is formed in the piezoelectric layer 124. Next, the conductive layer 126d is further patterned. In this way, the second conductive layer 126 is formed.

Figure 6:
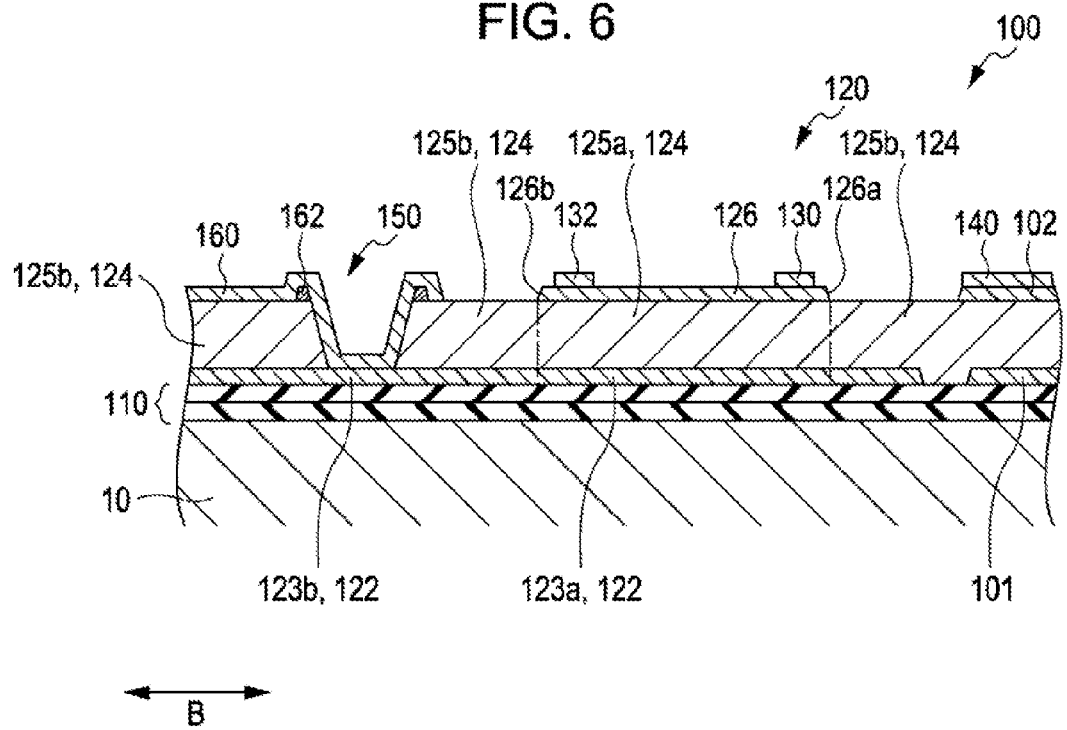
FIG. 6 is a sectional view schematically illustrating a process of manufacturing the liquid ejecting head according to the embodiment.

As shown in FIG. 6, the metal layers 130 and 132 including the extension portions 131 and 133, respectively, the lead electrodes 160, and the common electrode 140 are formed. Specifically, metal layers (not shown) are formed on the entire surfaces of the regions exposed on vibration plate 110, the first conductive layer 122, the piezoelectric layer 124, and the second conductive layer 126 by a known method such as a sputter method, and then the metal layers are patterned in desired shapes by a known etching process.

By the above-described processes, the actuator 100 can be manufactured.

Even though not illustrated, the first conductive layer 122 in the region where the sealing plate 40 is adhered may be removed before the process shown in FIG. 6. The vibration plate 110 in the region where the reservoir 15 is formed may be removed.

Figure 7:
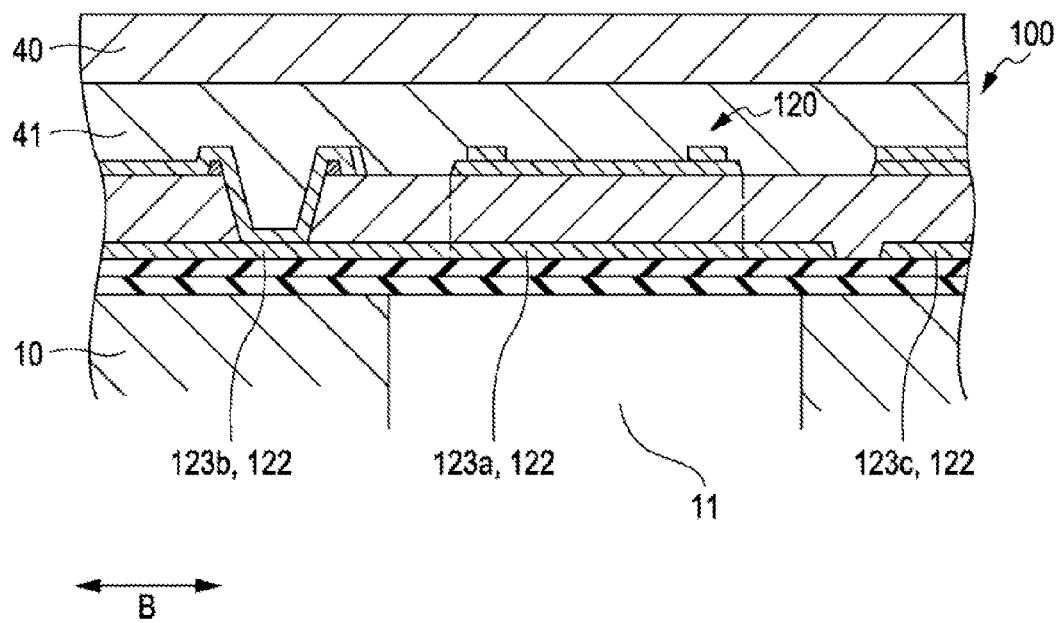
FIG. 7 is a sectional view schematically illustrating a process of manufacturing the liquid ejecting head according to the embodiment.

As shown in FIG. 7, the sealing plate 40 is mounted on the actuator 100. In this way, the driving units 120 can be sealed. The sealing plate 40 can be fixed by, for example, an adhesive. Next, the silicon substrate 1 is formed thinly so as to have a predetermined thickness, and then the pressure chambers 11, the supply passages 13, the communication passages 14, and the reservoir 15 are formed in the silicon substrate 1 (see FIGS. 1 and 7). For example, a mask (not shown) is formed on the surface opposite to the surface on which the vibration plate 110 is formed, so as to be patterned in a desired shape, and then the pressure chambers 11, the wall sections 12, the supply passages 13, the communication passages 14, and the reservoir 15 are partitioned by etching. In this way, the passage forming plate 10 including the pressure chambers 11 can be formed below the vibration plate 110. Next, the nozzle plate 20 including nozzle holes 21 is adhered to a predetermined position by, for example, an adhesive. In this way, the nozzle holes 21 communicate with the pressure chambers 11.

By the above-described processes, the liquid ejecting head 1000 can be manufactured. The method of manufacturing the liquid ejecting head 1000 is not limited to the above-described manufacturing method. For example, the passage forming plate 10 and the nozzle plate 20 may be integrally formed using an electroforming method.

According to the method of manufacturing the liquid ejecting head 1000, the metal layers 130 and 132, the lead electrodes 160, and the common electrode 140 can be formed by the process of patterning the metal layers. Accordingly, the metal layers 130 and 132, the lead electrodes 160, and the common electrode 140 can be formed by the simple and easy process.

3. Liquid Ejecting Apparatus

Figure 8:
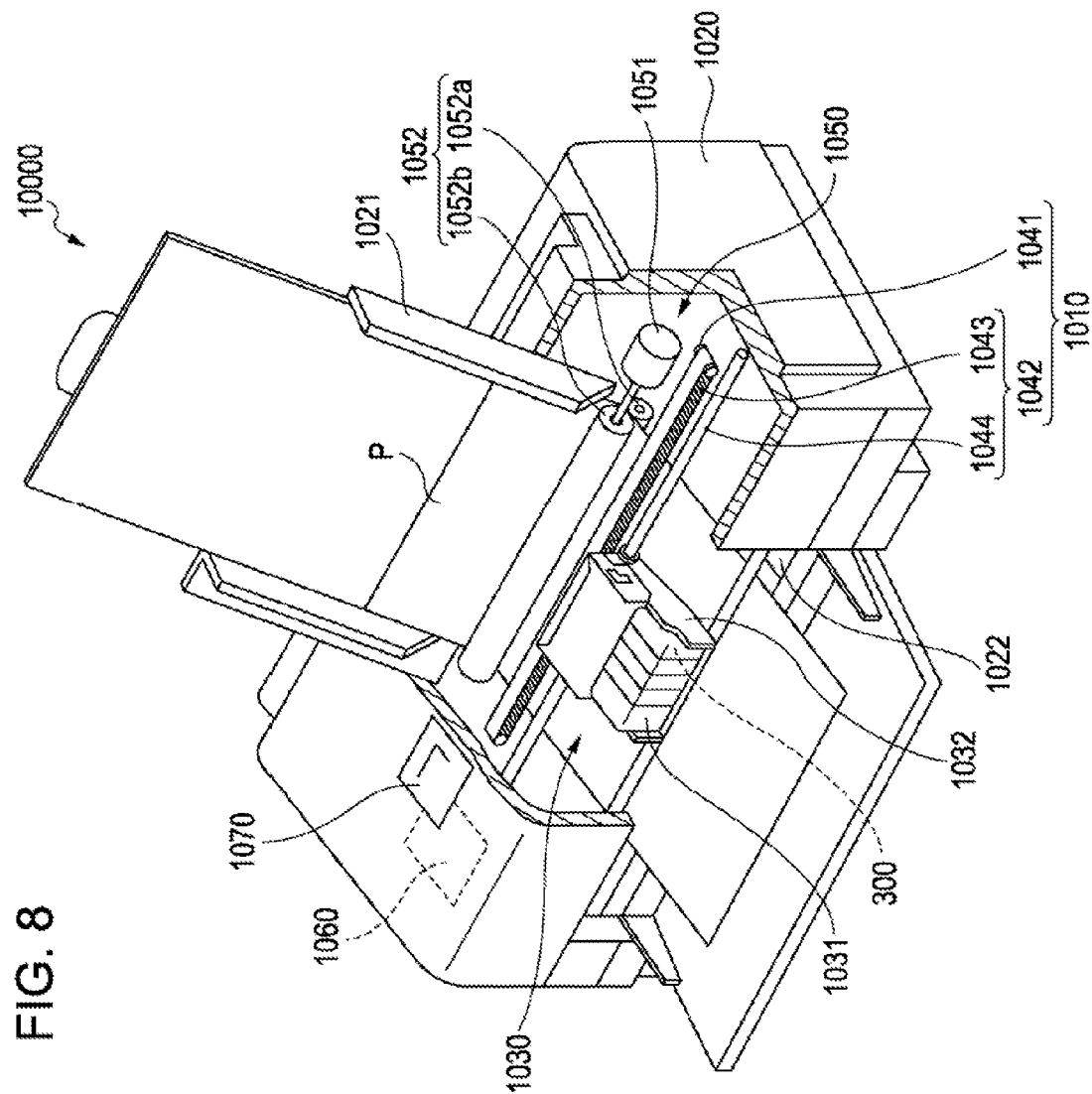
FIG. 8 is a perspective view schematically illustrating a liquid ejecting apparatus according to the embodiment.

Next, a liquid ejecting apparatus according to this embodiment will be described. The liquid ejecting apparatus according to this embodiment includes the liquid ejecting head according to the invention. Here, an ink jet printer will be described as an example of the liquid ejecting apparatus 1000 according to the embodiment. FIG. 8 is a perspective view schematically illustrating the liquid ejecting apparatus 10000 according to this embodiment.

The liquid ejecting apparatus 10000 includes a head unit 1030, a head unit driving unit 1010, and a control unit 1060. The liquid ejecting apparatus 10000 may include an apparatus main body 1020, a sheet feeding unit 1050, a tray 1021 accommodating a print sheet P, a sheet discharging port 1022 discharging the print sheet P, and an operation panel 1070 disposed on the surface of the apparatus main body 1020.

The head unit 1030 includes an ink jet print head (hereinafter, referred to as a "head") formed from the above-described liquid ejecting head 300. The head unit 1030 includes an ink cartridge 1031 supplying ink to the head and a transport unit (carriage) 1032 mounting the head and the ink cartridge 1031.

The head unit driving unit 1010 can reciprocate the head unit 1030. The head unit driving unit 1010 includes a carriage motor 1041 serving as a driving source of the head unit 1030 and a reciprocation mechanism 1042 receiving the rotation of the carriage motor 1041 and reciprocating the head unit 1030.

The reciprocation mechanism 1042 includes a carriage guide shaft 1044 of which both ends are held by a frame (not shown) and a timing belt 1043 extending in parallel to the carriage guide shaft 1044. The carriage guide shaft 1044 holds the carriage 1032 so that the carriage 1032 can reciprocate. The carriage 1032 is fixed to a part of the timing belt 1043. The head unit 1030 is guided along the carriage guide shaft 1044 so as to reciprocate, while the timing belt 1043 travels by the operation of the carriage motor 1041. During the reciprocating motion, the ink is appropriately ejected from the head and printing on the print sheet P is performed.

The control unit 1060 can control the head unit 1030, the head unit driving unit 1010, and the sheet feeding unit 1050.

The feeding unit 1050 can feed the print sheet P from the tray 1021 to the head unit 1030. The sheet feeding unit 1050 includes a sheet feeding motor 1051 serving as a driving source and a sheet feeding roller 1052 rotated by the operation of the sheet feeding motor 1051. The sheet feeding roller 1052 includes a driven roller 1052a and a driving roller 1052b vertically facing each other with the sending path of the print sheet P therebetween. The driving roller 1052b is connected to the sheet feeding motor 1051. When the sheet feeding unit 1050 is driven by the control unit 1060, the print sheet P is sent to pass below the head unit 1030.

The head unit 1030, the head unit driving unit 1010, the control unit 1060, and the sheet feeding unit 1050 are disposed inside the apparatus main body 1020.

The liquid ejecting apparatus 10000 may include the liquid ejecting head 1000. In the liquid ejecting head 1000, as described above, the plurality of driving units 120 can be connected to each other at a low resistance. Therefore, it is possible to realize the liquid ejecting apparatus 10000 in which the plurality of driving units 120 are connected to each other at a low resistance. According to the liquid ejecting head 1000, it is possible to improve reliability, since desired liquid droplets can be ejected, for example.

The ink jet printing head has hitherto been described as the liquid ejecting head. However, the liquid ejecting head according to the invention is also applicable to a color material ejecting head used to manufacture a color filter such as a liquid crystal display, an electrode material ejecting head used to form an electrode such as an organic EL display or a field emission display (FED), a bio-organism ejecting head used to manufacture a bio chip, and the like.

The above-described embodiment and modified examples described above are illustrative only and the invention is not limited thereto. For example, the embodiment and the modified examples may be appropriately combined.

Although the embodiment of the invention has been described in detail, the embodiment may be modified in various forms without practically departing from the novelties and advantages of the invention. Accordingly, it should be understood that the modifications are apparent to those skilled in the art, and the modifications are all included in the scope of the invention.

What is claimed is:

1. An actuator comprising:
   a vibration plate;
   a plurality of driving units disposed in a direction perpendicular to a predetermined direction, the plurality of driving units being formed on the vibration plate, wherein each driving unit includes:
      a first conductive layer formed on an upper surface of the vibration plate and extending in the predetermined direction;
      a piezoelectric layer covering the first conductive layer; and
      a second conductive layer formed on an upper surface of the piezoelectric layer;
   a metal layer formed on the upper surface of the vibration plate and on an upper surface of each second conductive layer of the plurality of driving units so as to intersect with and be electrically connected to each second conductive layer;
   an electrode electrically connected to the metal layer; and
   a plurality of lead electrodes, each of which electrically connects to the first conductive layer of an individual driving unit of the plurality of driving units through an opening in the piezoelectric layer of the individual driving unit.

2. The actuator according to claim 1, wherein the metal layer comprises a plurality of metal layers.

3. The actuator according to claim 2,
   wherein a first metal layer of a plurality of the metal layers is formed on the upper surface of each second conductive layer of the plurality of driving units and is located close to one end surface of each second conductive layer, and
   wherein a second metal layer of the plurality of metal layers is formed on the upper surface of each second conductive layer and is located close to an opposite end surface of each second conductive layer.

4. The actuator according to claim 3,
   wherein the first metal layer includes a first extension portion formed between adjacent driving units of the plurality of driving units and extending toward the one end surface of each conductive layer, and
   wherein the first extension portion is electrically connected to the electrode.

5. The actuator according to claim 4, wherein the second metal layer includes a second extension portion formed between the adjacent driving units of the plurality of driving units and extending toward the opposite end surface of each conductive layer.

6. The actuator according to claim 3, wherein the electrode, the first metal layer, and the second metal layer have a structure in which nickel-chrome alloy and gold are laminated.

7. The actuator according to claim 1, wherein the electrode and the metal layer each have a structure in which nickel-chrome alloy and gold are laminated.

8. A liquid ejecting head comprising:
   the actuator according to claim 1; and
   a pressure chamber which communicates with a nozzle hole and of which a volume is varied by an operation of the actuator.

9. A liquid ejecting apparatus comprising:
   the liquid ejecting head according to claim 8.

10. An actuator comprising:
    a vibration plate;
    a plurality of driving units disposed in a direction perpendicular to the predetermined direction, wherein each driving unit includes:
       a first conductive layer formed on an upper surface of the vibration plate and extending in a predetermined direction,
       a piezoelectric layer covering the first conductive layer, and
       a second conductive layer formed on an upper surface of the piezoelectric layer, such that the piezoelectric layer is interposed between the first and second conductive layers; and
    a metal layer formed on the upper surface of the vibration plate and on an upper surface of each second conductive layer of the plurality of driving units, so as to intersect and electrically connect each second conductive layer of the plurality of driving units, the metal layer including:
       a first metal layer electrically connected to and formed on the upper surface of each second conductive layer of the plurality of driving units at an end surface of each second conductive layer, and
       a second metal layer electrically connected to and formed on the upper surface of each second conductive layer of the plurality of driving units at the opposite end surface of each second conductive layer.

11. The actuator according to claim 10,
    wherein the first metal layer includes a first extension portion formed between adjacent driving units of the plurality of driving units and extending toward the one end surface of each conductive layer, and
    wherein the first extension portion is electrically connected to the electrode.

12. The actuator according to claim 11, wherein the second metal layer includes a second extension portion formed between the adjacent driving units of the plurality of driving units and extending toward the opposite end surface of each conductive layer.

13. The actuator according to claim 10, wherein the electrode and each of the metal layers each have a structure in which nickel-chrome alloy and gold are laminated.

14. A liquid ejecting head comprising:
    the actuator according to claim 10; and
    a pressure chamber which communicates with a nozzle hole and of which a volume is varied by an operation of the actuator.

15. A liquid ejecting apparatus comprising:
    the liquid ejecting head according to claim 14.

* * * * *